US009761781B2

(12) United States Patent
Sui et al.

(10) Patent No.: US 9,761,781 B2
(45) Date of Patent: Sep. 12, 2017

(54) THERMOELECTRIC GENERATOR SLEEVE FOR A CATALYTIC CONVERTER

(71) Applicants: Hyundai Motor Company, Seoul (KR); Kia Motors Corporation, Seoul (KR); Hyundai America Technical Center, Inc, Superior Township, MI (US)

(72) Inventors: Lang Sui, Ann Arbor, MI (US); Nayan Engineer, Canton, MI (US); Paul Neuman, Saint Joseph, MI (US)

(73) Assignees: Hyundai Motor Company, Seoul (KR); Kia Motors Corporation, Seoul (KR); Hyundai America Technical Center, Inc, Superior Township, MI (US)

( * ) Notice: Subject to any disclaimer, the term of this patent is extended or adjusted under 35 U.S.C. 154(b) by 195 days.

(21) Appl. No.: 14/556,114

(22) Filed: Nov. 29, 2014

(65) Prior Publication Data

US 2016/0155922 A1   Jun. 2, 2016

(51) Int. Cl.
*H01L 35/00* (2006.01)
*H02J 7/04* (2006.01)
(Continued)

(52) U.S. Cl.
CPC ............ *H01L 35/32* (2013.01); *F01N 3/0828* (2013.01); *H01L 35/06* (2013.01); *H01L 35/22* (2013.01);
(Continued)

(58) Field of Classification Search
CPC ......... H01L 35/00; H01L 35/28; H01L 35/30; H01L 35/32
(Continued)

(56) References Cited

U.S. PATENT DOCUMENTS 5,603,215 A * 2/1997 Sung .................... B01D 53/944
60/274
6,020,216 A * 2/2000 Beratan ............... H01L 27/1465
250/338.3
(Continued)

FOREIGN PATENT DOCUMENTS

JP 2000-018095 1/2000
JP 2008-523614 A 7/2008
(Continued)

OTHER PUBLICATIONS

Nanostructured Bulk Silicon as an Effective Thermoelectric Material by Bux et. Al., By Sabah K. Bux, Richard G. Blair, Pawan K. Gogna, Hohyun Lee, Gang Chen, Mildred S. Dresselhaus, Richard B. Kaner, and Jean-Pierre Fleurial;Bux et al—2009—Advanced Functional Materials, Adv. Funct. Matter. 2009, 19, pp. 2445-2452.*

*Primary Examiner* — M'Baye Diao
(74) *Attorney, Agent, or Firm* — Mintz Levin Cohn Ferris Glovsky and Popeo, P.C.; Peter F. Corless

(57) ABSTRACT

In one embodiment, a system is disclosed that includes a thermoelectric generator (TEG) layer that comprises a thermoelectric nanostructure. The system also includes a thermal conductance layer coupling the TEG layer to a catalytic converter and provides heat from an exhaust gas passing through the catalytic converter to the TEG layer. The system additionally includes a cooling layer coupled to the TEG layer opposite the thermal conductance layer that provides cooling to the TEG layer.

16 Claims, 5 Drawing Sheets

(51) Int. Cl.

| | | |
|---|---|---|
| *F01N 3/02* | (2006.01) | |
| *H01L 35/32* | (2006.01) | |
| *H01L 35/22* | (2006.01) | |
| *H01L 35/30* | (2006.01) | |
| *H01L 35/34* | (2006.01) | |
| *H01L 35/06* | (2006.01) | |
| *F01N 3/08* | (2006.01) | |
| *H02J 7/00* | (2006.01) | |

(52) U.S. Cl.
CPC .............. *H01L 35/30* (2013.01); *H01L 35/34* (2013.01); *H02J 7/007* (2013.01); *H02J 7/0052* (2013.01)

(58) Field of Classification Search
USPC ............................ 320/150; 136/200; 60/320
See application file for complete search history.

(56) References Cited

U.S. PATENT DOCUMENTS

| | | | | |
|---|---|---|---|---|
| 6,789,386 | B1* | 9/2004 | Haerle | F01N 3/2842 |
| | | | | 277/591 |
| 6,986,247 | B1* | 1/2006 | Parise | B01F 5/0614 |
| | | | | 136/205 |
| 8,646,261 | B2* | 2/2014 | Meisner | H01L 35/30 |
| | | | | 136/205 |
| 9,006,612 | B2* | 4/2015 | Sanchez | F03H 99/00 |
| | | | | 219/201 |
| 9,027,334 | B2* | 5/2015 | Backhaus-Ricoult | F01N 5/025 |
| | | | | 60/320 |
| 9,097,121 | B2* | 8/2015 | Joergl | F01D 9/026 |
| 9,151,523 | B2* | 10/2015 | Ilercil | F25B 21/02 |
| 2003/0223919 | A1* | 12/2003 | Kwak | B01D 53/9445 |
| | | | | 422/174 |
| 2008/0083446 | A1* | 4/2008 | Chakraborty | H01L 35/30 |
| | | | | 136/205 |
| 2010/0154396 | A1* | 6/2010 | Hahnl | F01N 5/025 |
| | | | | 60/320 |
| 2011/0067742 | A1* | 3/2011 | Bell | F01N 3/043 |
| | | | | 136/204 |
| 2011/0311421 | A1* | 12/2011 | Backhaus-Ricoult | B01D 53/9477 |
| | | | | 423/213.2 |
| 2012/0055527 | A1* | 3/2012 | Zika-Beyerlein | F02G 5/02 |
| | | | | 136/205 |
| 2012/0160290 | A1* | 6/2012 | Chen | F24J 2/32 |
| | | | | 136/206 |
| 2012/0247527 | A1* | 10/2012 | Scullin | B82Y 30/00 |
| | | | | 136/227 |
| 2013/0213448 | A1* | 8/2013 | Moczygemba | H01L 35/30 |
| | | | | 136/201 |
| 2014/0000249 | A1* | 1/2014 | Moors | F01N 5/025 |
| | | | | 60/320 |
| 2014/0305479 | A1* | 10/2014 | Nemir | H01L 35/32 |
| | | | | 136/203 |
| 2014/0318153 | A1* | 10/2014 | Ilercil | F25B 21/04 |
| | | | | 62/3.3 |
| 2014/0360545 | A1* | 12/2014 | Ghoshal | H01L 35/08 |
| | | | | 136/200 |
| 2015/0122303 | A1* | 5/2015 | Kato | H01L 35/16 |
| | | | | 136/240 |
| 2016/0035957 | A1* | 2/2016 | Casey | H01L 35/32 |
| | | | | 136/230 |

FOREIGN PATENT DOCUMENTS

| | | |
|---|---|---|
| KR | 10-2012-0036113 A | 4/2012 |
| KR | 10-2012-0102188 A | 9/2012 |
| KR | 10-2013-0039149 A | 4/2013 |
| KR | 2013-0068022 | 6/2013 |
| KR | 2013-0068025 | 6/2013 |

* cited by examiner

THERMOELECTRIC GENERATOR SLEEVE FOR A CATALYTIC CONVERTER

BACKGROUND (a) Technical Field

The present disclosure generally relates to thermoelectric generators (TEGs). In particular, a TEG sleeve for a catalytic converter is disclosed that converts exhaust gas heat into electrical energy.

(b) Background Art

Thermoelectric generators (TEGs) are devices that are capable of converting heat into electrical energy. TEGs can be employed to improve operational efficiency of a myriad of applications. One such application is automobiles, where TEGs may be utilized to recover usable energy from automobile waste heat. More specifically, a TEG may convert waste heat, e.g., exhaust heat, in an internal combustion engine (IC) into electricity. For example, a catalytic converter in a vehicle's exhaust system may become very hot during use of the vehicle due to the thermal energy present in the exhaust gas. This electricity may then be utilized by other components within the automobile, which can increase the overall fuel economy and improve vehicle emissions, e.g., a charge for a battery, electrical components, etc.

Current automobile TEGs, however, suffer from drawbacks which can hinder the device's potential usefulness. For example, current automobile TEGs are typically complex in their assembly and are difficult to remove. As a result, modifying the engine design may be necessary to accommodate the TEG and repairing and/or replacing the TEG can be expensive and time-consuming In addition, these modifications also typically prevent older vehicles from being retrofitted with a TEG. Therefore, there is currently a need for a TEG which is highly efficient, yet has a minimal size and weight, is easily removable, and has an assembly of minimal complexity.

The above information disclosed in this Background section is only for enhancement of understanding of the background of the invention and therefore it may contain information that does not form the prior art that is already known in this country to a person of ordinary skill in the art.

SUMMARY OF THE DISCLOSURE

The present invention provides systems and methods for attaching one or more thermoelectric generators (TEGs) to an engine exhaust system. In particular, a TEG sleeve is disclosed for mounting to a catalytic converter.

In one embodiment, a system is disclosed that includes a thermoelectric generator (TEG) layer that comprises a thermoelectric nanostructure. The system also includes a thermal conductance layer coupling the TEG layer to a catalytic converter and provides heat from an exhaust gas passing through the catalytic converter to the TEG layer. The system additionally includes a cooling layer coupled to the TEG layer opposite the thermal conductance layer that provides cooling to the TEG layer.

In one aspect, the cooling layer may include a heat sink that may also include cooling fins. In some aspects, the heat sink is constructed using aluminum. In one aspect, the thermal conductance layer may include a plurality of steel plates disposed around the catalytic converter. In another aspect, the system may include thermal insulation that thermally isolates the cooling device from the thermal conductance layer. In a further aspect, the thermal insulation may be located around fasteners used to couple the cooling and TEG layers to the thermal conductance layer. In another aspect, the cooling layer may be a coolant jacket. In a further aspect, the coolant jacket may include an inlet and an outlet that are formed on the coolant jacket and configured to allow coolant to pass through the hollow chamber of the jacket. In yet another aspect, the TEG layer is constructed using a silicon-based nanostructure.

In another embodiment, a method is disclosed. The method includes receiving, at a thermoelectric generator (TEG) layer that comprises a thermoelectric nanostructure, heating from a thermal conductance layer coupled to a catalytic converter and to the TEG layer. The method also includes receiving, at the TEG layer, cooling from a cooling layer coupled to the TEG layer. The method further includes generating, by the TEG layer, electrical energy in response to a temperature difference between the received heating and cooling from the thermal conductance and cooling layers.

In one aspect, the method may include providing a current to the TEG layer to preheat the catalytic converter. In another aspect, the method may include receiving a liquid coolant at the cooling layer. In a further aspect, the method may include receiving air cooling at cooling fins of the cooling layer. In yet another aspect, the method may include storing the generated electrical energy in a battery. In some aspects, the method may include thermally isolating the thermal conductance layer from the cooling layer. In an additional aspect, the method may include coupling the thermal conductance layer, the TEG layer, and the cooling layer to the catalytic converter.

In another embodiment, an apparatus is disclosed. The apparatus includes means for receiving thermal energy from a catalytic converter. The apparatus also includes means for converting the thermal energy into electrical energy.

In various aspects, the apparatus may include means for providing liquid cooling or means for providing air cooling.

Advantageously, the techniques described herein provide for systems and methods whereby heat from exhaust gas from an engine may be converted into electrical energy.

BRIEF DESCRIPTION OF THE DRAWINGS

The above and other features of the present invention will now be described in detail with reference to certain exemplary embodiments thereof illustrated the accompanying drawings which are given herein below by way of illustration only, and thus are not limitative of the present invention, and wherein.

Figure 1:
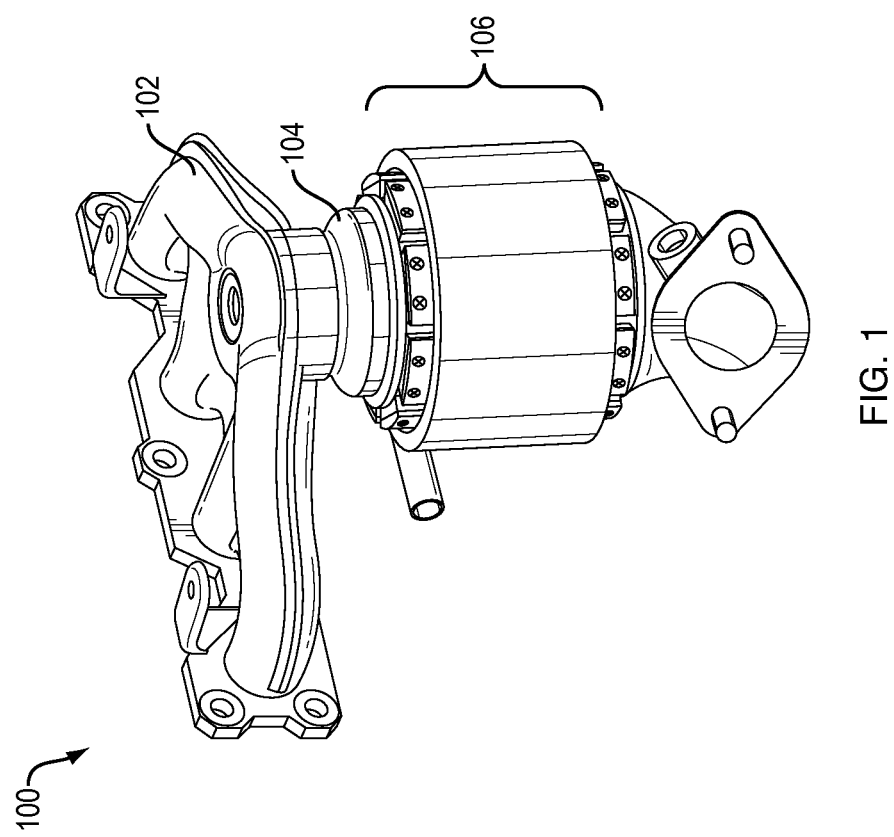
FIG. 1 illustrates an example fluid-cooled TEG system for a catalytic converter.

It should be understood that the appended drawings are not necessarily to scale, presenting a somewhat simplified representation of various preferred features illustrative of the basic principles of the invention. The specific design features of the present invention as disclosed herein, including, for example, specific dimensions, orientations, locations, and shapes will be determined in part by the particular intended application and use environment.

In the figures, reference numbers refer to the same or equivalent parts of the present invention throughout the several figures of the drawing.

DETAILED DESCRIPTION

Hereinafter, the present disclosure will be described so as to be easily embodied by those skilled in the art.

It is understood that the term "vehicle" or "vehicular" or other similar term as used herein is inclusive of motor vehicles in general such as passenger automobiles including sports utility vehicles (SUV), buses, trucks, various commercial vehicles, watercraft including a variety of boats and ships, aircraft, and the like, and includes hybrid vehicles, plug-in hybrid electric vehicles, and other alternative fuel vehicles (e.g., fuels derived from resources other than petroleum). As referred to herein, a hybrid vehicle is a vehicle that has two or more sources of power, for example both gasoline-powered and electric-powered vehicles.

Additionally, it is understood that some of the methods may be executed by at least one controller. The term controller refers to a hardware device that includes a memory and a processor configured to execute one or more steps that should be interpreted as its algorithmic structure. The memory is configured to store algorithmic steps and the processor is specifically configured to execute said algorithmic steps to perform one or more processes which are described further below.

Furthermore, the control logic of the present invention may be embodied as non-transitory computer readable media on a computer readable medium containing executable program instructions executed by a processor, controller or the like. Examples of the computer readable mediums include, but are not limited to, ROM, RAM, compact disc (CD)-ROMs, magnetic tapes, floppy disks, flash drives, smart cards and optical data storage devices. The computer readable recording medium can also be distributed in network coupled computer systems so that the computer readable media is stored and executed in a distributed fashion, e.g., by a telematics server or a Controller Area Network (CAN).

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

The present invention generally provides a thermoelectric generator (TEG) system that may be coupled to a catalytic converter. Energy losses from an engine in the form of heated exhaust gas passing through the catalytic converter may be converted by the TEG system into electrical energy.

Referring now to FIG. 1, an example fluid-cooled TEG system 106 is shown as part of an exhaust system 100, according to various embodiments. As shown, exhaust system 100 may generally operate to remove exhaust gas from a coupled engine after combustion. For example, exhaust system 100 may include an exhaust manifold 102 that is coupled to the engine and provides a path for exhaust gas within the engine to be diverted away from the engine's combustion chambers.

In some embodiments, exhaust system 100 also includes a catalytic converter 104 coupled to exhaust manifold 102. In general, catalytic converter 104 operates to remove pollutants from the exhaust gas prior to exhaust system 100 releasing the gas into the atmosphere. For example, catalytic converter 104 may chemically react carbon monoxide (CO) or unburnt hydrocarbons present in the exhaust gas to produce carbon dioxide ($CO_2$) and/or water ($H_2O$). In some cases, catalytic converter 104 may be a three-way system that also chemically reduces $NO_x$ gasses (e.g., nitrogen dioxide, etc.) into less harmful nitrogen ($N_2$) and oxygen ($O_2$) gasses.

According to various embodiments, thermoelectric generator (TEG) system 106 may be coupled to catalytic converter 104 in exhaust system 100. Generally speaking, TEG system 106 operates by converting heat present in the exhaust gas passing through catalytic converter 104 into electrical energy. In some cases, up to 40% of combustion energy produced by an engine may be lost as heat within the engine's exhaust gas. TEG system 106 may be utilized to recapture some of this energy by converting the heat in the exhaust gas into electrical energy. For example, TEG system 106 may be electrically connected to the battery of the vehicle, allowing the recovered energy to be stored until needed. In some cases, the alternator of the vehicle can also be downsized as a result of the recovered electrical energy.

While TEG system 106 is shown herein primarily with respect to vehicle exhaust systems, it is to be appreciated that TEG system 106 may be adapted for use with any other form of non-vehicle exhaust system. Also, it is to be appreciated that the location of catalytic converter 104 within an exhaust system may be varied, in other embodiments.

Figure 2:
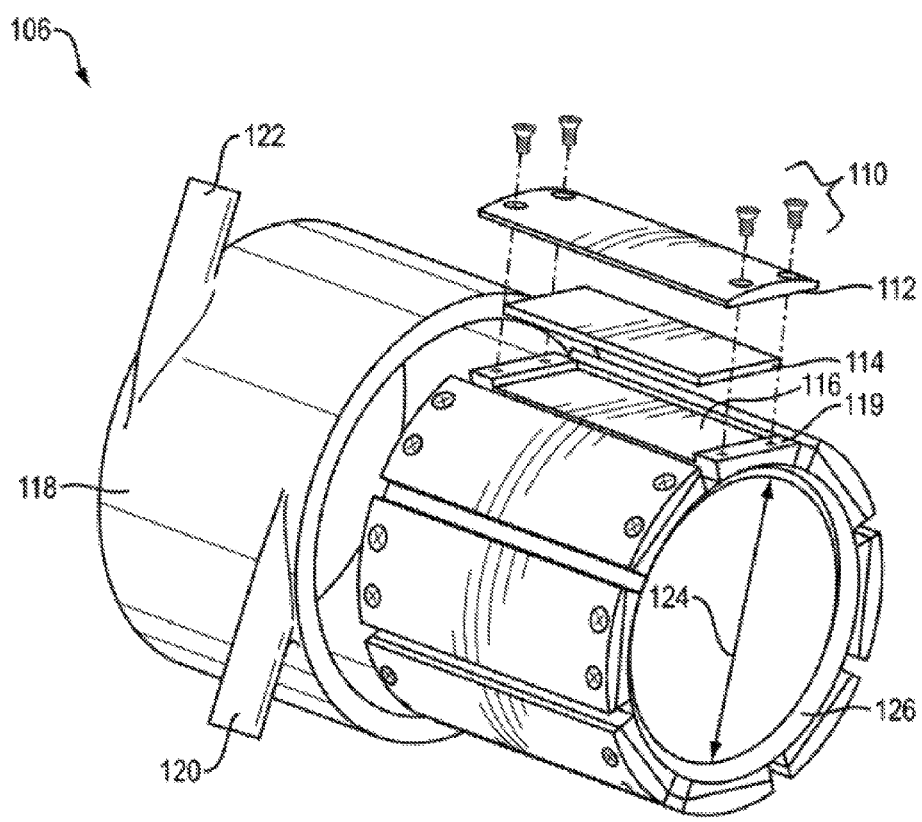
FIG. 2 illustrates an example exploded view of the TEG system of FIG. 1.

Referring now to FIG. 2, an exploded view of TEG system 106 is shown, according to various embodiments. In various embodiments, TEG system 106 forms a "sleeve" that encompasses catalytic converter 104. In other words, when assembled, TEG system 106 may define a hollow, substantially cylindrical aperture 126 having a diameter 124 that corresponds to the outer diameter of catalytic converter 104.

TEG system 106 generally includes three layers: 1.) a thermally conductive layer, 2.) a TEG layer, and 3.) a cooling layer. During operation, the thermally conductive layer transfers heat from catalytic converter 104 into the TEG layer. Similarly, the cooling layer provides cooling to the TEG layer on a side opposing the heated side, to produce a temperature differential within the TEG layer. This temperature difference causes an electric current to be produced within the TEG layer, thus allowing the thermal energy present in the exhaust gas to be recaptured as electrical energy.

As shown, the thermally conductive layer may be formed by one or more thermally conductive plates 116 positioned around catalytic converter 104. Plates 116 may be constructed using any suitable material capable of transferring heat to the TEG layer, while still retaining its structural properties at operating temperatures. For example, the material used to construct plates 116 may be selected to withstand temperatures in excess of 500° C. In one embodiment, plates 116 are constructed using steel, which has been shown to have sufficient thermal conductivity and temperature resistance for TEG applications.

The TEG layer of system 106 may be formed using any number of TEG panels 114 coupled to thermally conductive plates 116. Each of TEG panels 114 may be constructed using a silicon-based nanostructure or, alternatively, composed of other suitable compounds comprising, for example, bismuth, lead, magnesium, selenium, tellurium, germanium, antimony, nichrome, and the like. The silicon-based nanostructure is a highly efficient TEG-adaptable material, which allows for the size of the TEG panels 114 to be significantly reduced. A single TEG pair may consist of one n-type (e.g., material having an excess of electrons) and one p-type nanostructure (e.g., material having an excess of holes), or alternatively, one n-type nanostructure or one p-type nanostructure. Any number of TEG pairs may be used to form TEG panels 114 and may be selected according to the size of TEG system 106. Nanostructure and nanophase material suitable for use in TEG panels 114 may include, but are not limited to, nanoporous material, nanowire, and nano-dimensional precipitates and lamellae formation in bulk materials. In one embodiment, one or more dimensions of the structure and/or phases is larger than the mean-free-path of the electron or hole. In another embodiment, one or more dimensions of the structure and/or phases are smaller than the phonon wavelength of the material.

Notably, while "layer" is used herein with respect to various components of TEG system 106, this term is intended to describe the physical locations of the components within system 106 and not their actual construction. For example, as would be appreciated, TEG layer 114 may comprise any number of TEG arrays that may or may not be "layered," such as pairs of oppositely doped materials. Said differently, the term "layer" is not intended to be limiting to particular types or formations of materials.

As noted previously, TEG panels 114 produce electrical energy in response to a temperature difference exhibited across a given panel. In some embodiments, TEG system 106 may include a liquid-cooled mechanism that cools a given TEG panel 114 on a side opposite that of a given panel 116. As shown, for example, the cooling layer may include a cooling jacket 118 that encompasses the TEG layer. Cooling jacket 118 may be coupled to TEG panels 114 via coupling panels 112 that are constructed using a thermally conductive material. In other embodiments, TEG panels 114 may be directly coupled to cooling jacket 118.

Cooling jacket 118 may include an inlet 122 and an outlet 120 that are fluidically connected via one or more hollow chambers located internal to cooling jacket 118. During operation, a cooled liquid is provided to inlet 122, circulated around the circumference of catalytic converter 104 where the liquid receives heat from the TEG layer of system 106, and is carried out through outlet 120. The warmed liquid is then chilled (e.g., via a heat sink or other mechanism) and the chilled liquid is returned back to inlet 122. Any liquid may be used within cooling jacket 118, such as water, ethylene glycol, combinations thereof, or the like. In one embodiment, cooling jacket 118 is part of an independent cooling system that operates only to cool TEG system 106. In another embodiment, cooling jacket 118 is integrated into the cooling system of the engine, thereby providing cooling to both the engine itself and to TEG system 106. Thus, when catalytic converter 104 is heated (e.g., due to heated exhaust gas passing through catalytic converter 104), a temperature difference may be exhibited across a given TEG panel 114 by cooling the side of the panel opposite the heated side.

Cooling jacket 118 may be coupled to any of panels 112-116 within TEG system 106 in any number of ways. For example, cooling jacket 118 may be coupled to coupling panels 112 via an adhesive, thermal paste, fasteners, or any other coupling means.

The layers of TEG system 106 may be coupled together in any number of ways. In some embodiments, fasteners 110 may be inserted through panels 112-116 and into a receiving sleeve 119 or into catalytic converter 104 itself, to secure TEG system 106 to catalytic converter 104. In some embodiments, thermal insulation material may be placed around fasteners 110, to thermally isolate a particular plate 116 from a corresponding plate 112. In another embodiment, fasteners 110 may be formed using a thermal insulation material. Other securing mechanisms may also be used in other embodiments, such as adhesion, welding, making TEG system 106 integral to catalytic converter 104, etc.).

In one embodiment, TEG panels 114 may be operated in reverse to provide preheating to catalytic converter 104. In other words, an electrical current may be provided to TEG panels 114 to generate heat. Such heat may be transferred to catalytic converter 104 through panels 116, thereby heating catalytic converter 104 (e.g., after the vehicle was just started, etc.).

Figure 3:
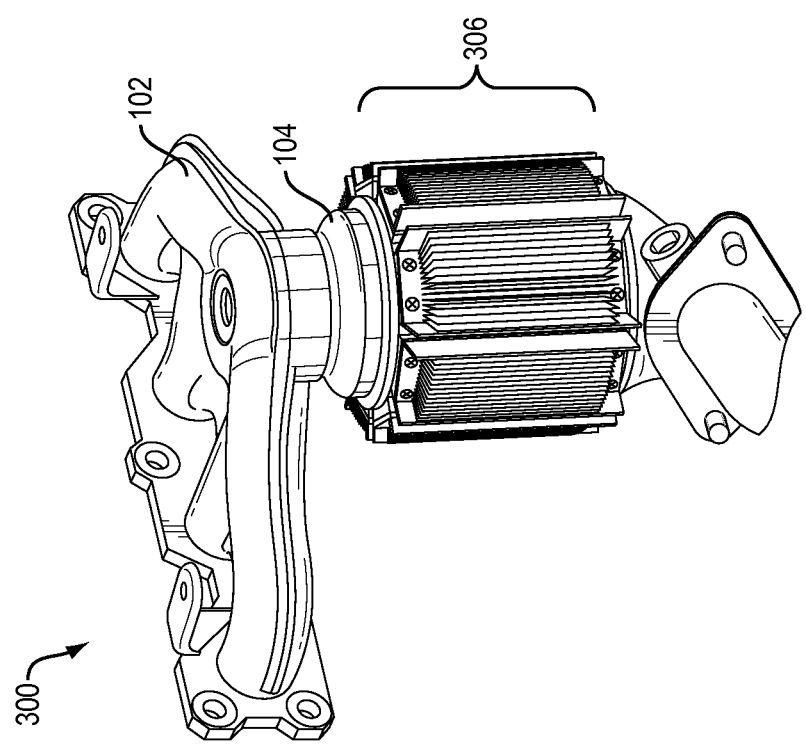
FIG. 3 illustrates an example view of an air-cooled TEG system.

Referring now to FIG. 3, an air-cooled TEG system is shown, according to various embodiments. As shown, exhaust system 300 includes exhaust manifold 102 and catalytic converter 104 discussed previously. In addition, exhaust system 300 includes an air-cooled TEG system 306 that encompasses catalytic converter 104. Like TEG system 106, TEG system 306 operates by converting thermal energy present in exhaust gas passing through catalytic converter 104 into electrical energy.

Figure 4:
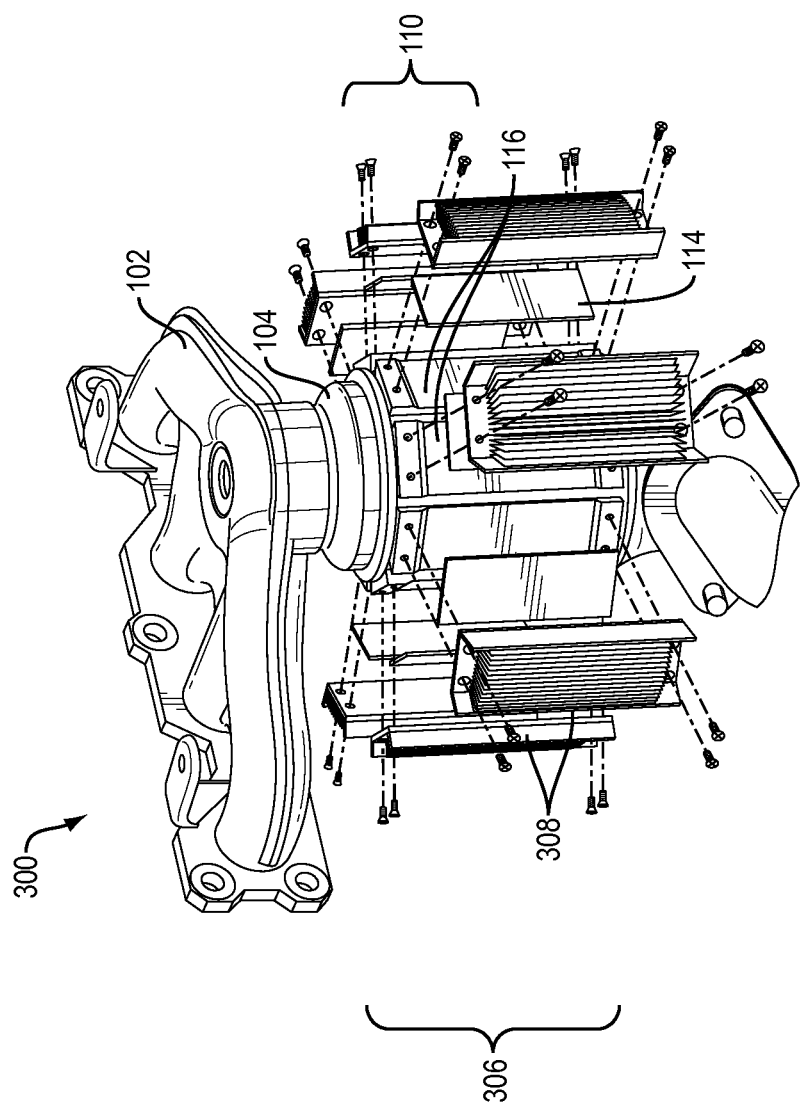
FIG. 4 illustrates an example exploded view of the TEG system of FIG. 3.

An exploded view of TEG system 306 is shown in FIG. 4, in one embodiment. As shown, TEG system 306 may be constructed in a similar manner as that of TEG system 106. In other words, TEG system 306 may generally include a thermally conductive layer that receives heat from catalytic converter 104, a TEG layer that receives the heating, and a cooling layer that cools an opposing side of the TEG layer. For example, as shown, TEG system 306 may include a number of plates 116 in the thermally conductive layer and any number of TEG plates 116. The layers of TEG system 306 may also be coupled in a manner similar to that of TEG system 106 (e.g., via fasteners 110, etc.), as detailed above.

In some embodiments, TEG system 306 is air-cooled by heat sinks 308 which provide cooling to TEG plates 116. Heat sinks 308 may be constructed using a thermally conductive material, such as aluminum. As shown, heat sinks 308 may include a number of fin structures to increase the surface area of heat sinks 308, thereby increasing the amount of cooling provided to the TEG layer. In further embodiments, the air cooling mechanisms of TEG system 306 may be combined with the liquid cooling mechanism of TEG system 106 (e.g., using both air cooling and liquid cooling on one side of the TEG layer).

Figure 5:
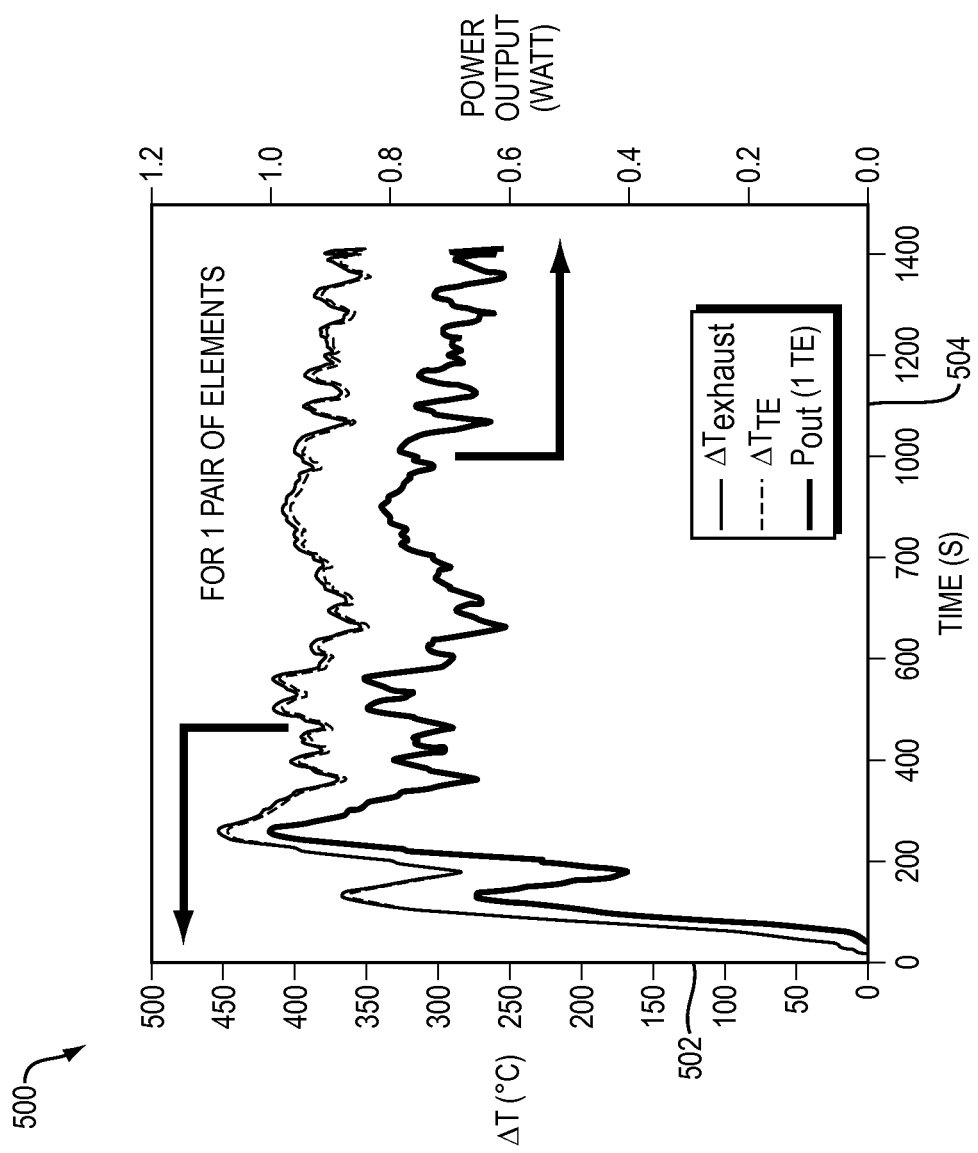
FIG. 5 illustrates an example graph of electrical power generation by a TEG.

Referring now to FIG. 5, an example graph 500 of electrical power generation by a TEG is shown, according to various embodiments. As shown, the amount of electrical power generated by a pair of TEG elements is plotted a function of temperature differential 502 and time 504.

Based on a city driving cycle, the temperature of exhaust gas ranges typically ranges from 350-450° C. Temperature from airflow around an exhaust pipe has also been shown to range from 25-45° C., depending on the speed of the vehicle and the ambient temperature. Thus, a TEG system in accordance with to the teachings herein has the potential of producing a temperature differential of approximately 400° C. From graph 400, it can be seen that a 400 degree temperature difference in pair of TEG elements generates approximately 1 Watt (W) of power. Notably, the temperatures depicted in FIG. 5 are illustrative only and may vary depending on the configuration of the vehicle itself (e.g., the available amount of airflow for cooling may depend on the shape of the vehicle), the configuration of the vehicle's exhaust system, and/or the relative location of a TEG system within the exhaust system (e.g., temperatures may be greater upstream in the exhaust system than downstream).

As mentioned previously, up to 40% of energy losses from a combustion engine are attributable to heat within the exhaust gas. For a typical 100 horsepower engine operating at peak horsepower and generating 75 kW of power, up to 30 kW of this power may be lost via heated exhaust gas. A typical TEG module described herein has been shown to provide between 4-10% recovery of energy, meaning that between 1.2 kW and 3 kW of power may potentially be recapture as electrical power using the systems described herein.

Advantageously, the techniques described herein provide for a TEG system that can be coupled to a catalytic converter. Thermal energy present in exhaust gas that would be otherwise wasted is converted by the TEG system into electrical energy, allowing some of the energy losses of the engine to be recaptured.

While the embodiment of the present disclosure has been described in detail, the scope of the right of the present disclosure is not limited to the above-described embodiment, and various modifications and improved forms by those skilled in the art who use the basic concept of the present disclosure defined in the appended claims also belong to the scope of the right of the present disclosure.

What is claimed is:

1. A system, comprising:
   a thermoelectric generator (TEG) layer that comprises a thermoelectric nanostructure;
   a thermal conductance layer contacting with the TEG layer and a catalytic converter, wherein the thermal conductance layer provides heat from an exhaust gas passing through the catalytic converter to the TEG layer;
   a cooling layer coupled to the TEG layer opposite the thermal conductance layer that provides cooling to the TEG layer; and
   a thermal insulation that thermally isolates the cooling layer from thermal conductance layer and is disposed around the TEG layer.

2. The system as in claim 1, wherein the cooling layer comprises a heat sink.

3. The system as in claim 2, wherein the heat sink includes cooling fins.

4. The system as in claim 2, wherein the heat sink comprises aluminum.

5. The system as in claim 1, wherein the thermal conductance layer comprises a plurality of steel plates disposed around the catalytic converter.

6. The system as in claim 1, wherein fasteners for coupling the cooling layer and TEG layer to the thermal conductance layer is made of a thermal insulation material.

7. The system as in claim 1, wherein the cooling layer comprises a coolant jacket.

8. The system as in claim 7, wherein the coolant jacket comprises an inlet and an outlet that are formed on the coolant jacket and configured to allow coolant to pass through the hollow chamber of the jacket.

9. The system as in claim 1, wherein the TEG layer comprises a silicon-based nanostructure.

10. The system of claim 9, wherein one or more dimensions of the silicon-based nanostructure are smaller than the phonon wavelength of the material.

11. A method comprising:
    receiving, at a thermoelectric generator (TEG) layer, heating from a thermal conductance layer that contacts with a catalytic converter and the TEG layer, wherein the TEG layer comprises a thermoelectric nanostructure;
    receiving, at the TEG layer, cooling from a cooling layer coupled to the TEG layer; and
    generating, by the TEG layer, electrical energy in response to a temperature difference between the received heating and cooling from the thermal conductance and cooling layers,
    wherein a thermal insulation thermally isolates the cooling layer from the thermal conductance layer and is disposed around the TEG layer.

12. The method as in claim 11, further comprising:
    providing a current to the TEG layer to preheat the catalytic converter.

13. The method as in claim 11, further comprising:
    receiving a liquid coolant at the cooling layer.

14. The method as in claim 11, further comprising:
    receiving air cooling at cooling fins of the cooling layer.

15. The method as in claim 11, further comprising:
    storing the generated electrical energy in a battery.

16. The method as in claim 11, further comprising:
    coupling the thermal conductance layer, the TEG layer, and the cooling layer to the catalytic converter.

* * * * *